(12) United States Patent
Suzuki et al.

(10) Patent No.: US 6,930,334 B2
(45) Date of Patent: Aug. 16, 2005

(54) HIGH FREQUENCY SEMICONDUCTOR DEVICE

(75) Inventors: Yoji Suzuki, Kawasaki (JP); Keiji Minetani, Yamanashi (JP)

(73) Assignee: Fujitsu Quantum Devices Limited, Yamanashi (JP)

( * ) Notice: Subject to any disclaimer, the term of this patent is extended or adjusted under 35 U.S.C. 154(b) by 13 days.

(21) Appl. No.: 10/301,816

(22) Filed: Nov. 22, 2002

(65) Prior Publication Data

US 2003/0122153 A1 Jul. 3, 2003

(30) Foreign Application Priority Data

Nov. 29, 2001 (JP) ........................................ 2001-364165

(51) Int. Cl.[7] .................... H01L 29/80; H01L 31/112; H01L 23/04; H01L 23/34; H01L 23/68
(52) U.S. Cl. ...................... 257/275; 257/277; 257/698; 257/728; 257/737; 257/778
(58) Field of Search ................................ 257/275–277, 257/690, 692, 698, 700, 728–730, 737–738, 777–781; 333/104, 161, 204, 238, 246

(56) References Cited

U.S. PATENT DOCUMENTS

| | | | | |
|---|---|---|---|---|
| 4,992,764 A | * | 2/1991 | Ayasli | ........................ 333/247 |
| 5,202,752 A | * | 4/1993 | Honjo | ........................ 257/678 |
| 5,528,209 A | * | 6/1996 | Macdonald et al. | ........ 333/247 |
| 5,532,506 A | * | 7/1996 | Tserng | ........................ 257/276 |
| 5,635,762 A | * | 6/1997 | Gamand | ..................... 257/728 |
| 5,710,068 A | * | 1/1998 | Hill | ............................. 438/171 |
| 2002/0003291 A1 | * | 1/2002 | Lamson et al | .............. 257/666 |
| 2003/0040440 A1 | * | 2/2003 | Wire et al. | ................... 505/210 |
| 2003/0103006 A1 | * | 6/2003 | Yamada | ............... 343/700 MS |

* cited by examiner

Primary Examiner—Shouxiang Hu
(74) Attorney, Agent, or Firm—Armstrong, Kratz, Quintos, Hanson & Brooks, LLP

(57) ABSTRACT

A high frequency semiconductor device including a high frequency semiconductor chip, comprising an active region provided on a front face side of the high frequency semiconductor chip; a covering electrode provided on the active region and connected to a ground potential; and a back face wiring provided on a back face side of the high frequency semiconductor chip. The back face wiring forms a high frequency transmission line together with the covering electrode functioning as a high frequency ground plate. A front face wiring may be provided on the front face side of the high frequency semiconductor chip to form a high frequency transmission line together with the covering electrode.

15 Claims, 3 Drawing Sheets

HIGH FREQUENCY SEMICONDUCTOR DEVICE

BACKGROUND OF THE INVENTION

1. Field of the Invention

The present invention generally relates to a high frequency semiconductor device, and more specifically relates to high frequency semiconductor devices including an HEMT (high electron mobility transistor) that can prevent variations in a characteristic impedance of a high frequency transmission line formed by a wiring on a chip and a ground plate.

2. Description of the Related Art

In the prior art, a face-down mounting structure is known in which a high frequency semiconductor device such as GaAs including an HEMT is laid face-down on a wiring substrate in order to bond a wiring layer on the face of the device to the wiring substrate.

Referring now to FIG. 6, a conventional face-down mounting structure will be explained. FIG. 6 shows a schematic cross-sectional view of a prior art face-down mounting structure. As shown in FIG. 6, a high frequency semiconductor chip 91 has wirings 92 on a front face thereof. A protection layer 93 is provided to cover and protect the wirings 92. An input pad 94 and an output pad 95 are provided at the periphery of the semiconductor chip 91. The high frequency semiconductor chip 91 is laid face-down on a wiring substrate 96 so that the front face having the wirings 92 faces down. The wiring substrate 96 has a ground electrode 97, an input pad 98 and an output pad 99. The input pad 94 and the input pad 98 are aligned with each other, and the output pad 95 and the output pad 99 are aligned with each other, then they are heated and connected by bumps 100 respectively, completing a face-down bonding process.

In this face-down mounting structure, no bonding wire is required and therefore the lead-out of electrodes can be shortened. Further, an active region of the high frequency semiconductor chip that is an exothermic portion is arranged at the side of the wiring substrate 96, and therefore heat release can be easily obtained via the wiring substrate 96.

In this face-down mounting structure for a high frequency semiconductor chip, the ground electrode 97 is provided on the upper face of the wiring substrate or mounting substrate 96 that is opposite the high frequency semiconductor chip 91. This ground electrode 97 and the wirings 92 on the high frequency semiconductor chip 91 together form a high frequency transmission line to realize high-speed transmission of signals on the high frequency semiconductor chip 91.

FIG. 7 shows one example of surface wiring patterns of prior art wiring substrates. A wiring substrate 101 has an input pad 103 at one end, and a plurality of output pads 104 through 106 at another end. An all-over pattern of ground electrode 102 is provided in the middle of the wiring substrate 101. This ground electrode 102 and a wiring (not shown) provided in a high frequency semiconductor chip together form an MSL (micro-strip line) type of high frequency transmission line. Power supply pads 107, 108 for connecting to power supplies are provided at adequate places.

In this face-down mounting structure, however, the sizes of the connecting bumps 100 are non-uniform or the planarity of the wiring substrate is poor, and therefore the distances between the wirings provided on the high frequency semiconductor chip and the wiring substrate, that is the clearances between the wirings and the ground electrode are not constant, resulting in variations in characteristic impedance of the transmission lines.

SUMMARY OF THE INVENTION

An object of the present invention is to provide a high frequency semiconductor device that substantially reduces variations in characteristic impedance of high transmission lines formed by a ground electrode and wirings provided in a high frequency semiconductor chip.

Features and advantages of the present invention will be set forth in the description that follows, and in part will become apparent from the description and the accompanying drawings, or may be learned by practice of the invention according to the teachings provided in the description. Objects as well as other features and advantages of the present invention will be realized and attained by the high frequency semiconductor device particularly pointed out in the specification in such full, clear, concise, and exact terms as to enable a person having ordinary skill in the art to practice the invention.

FIG. 1 shows a schematic cross-sectional view of a high frequency semiconductor device to explain the principle of the present invention. Referring to FIG. 1, how to solve the above mentioned problem will be explained.

(1) In order to attain the object, the high frequency semiconductor device according to one feature of the present invention includes a high frequency semiconductor chip 2, comprising an active region provided on a front face side of the high frequency semiconductor chip; a covering electrode 8 provided on the active region and connected to a ground potential; and a back face wiring 3 provided on a back face side of the high frequency semiconductor chip, and forming a high frequency transmission line together with the covering electrode as a high frequency ground plate.

In this manner, the clearances between wirings 3 and the covering electrode 8 may be constant by using a precise semiconductor process. The covering electrode 8 can be electrically connected to a ground electrode 9 via a brazing material 10 to become ground potential.

In this case, between the active region and the covering electrode 8 is provided a protection layer 7 formed by a semiconductor process. It is difficult to make the protection layer 7 thick, and therefore the clearance between the covering electrode 8 and the wirings 5 is narrow, resulting in large capacitance. Accordingly, in order to obtain a desired impedance, for example 50 ohm, it is necessary to make the widths of the wirings 5 narrow, resulting in a small power limit passing through the wirings 5.

In the case where the back face wirings 3 are utilized to form the high frequency transmission line, the back face wirings 3 and the covering electrode 8 are capacitively coupled via the high frequency semiconductor chip 2, and the wide clearance reduces the electrostatic capacitance. Accordingly, broad widths of the wirings can be employed for a desired characteristic impedance.

(2) According to another feature of the present invention, the high frequency semiconductor device as mentioned in (1) above further comprises a front face wiring 5 provided on the front face side of the high frequency semiconductor chip 2, and forming a high frequency transmission line together with the covering electrode 8 as a ground plate.

In this manner, the wirings provided on the front face side can be utilized to form the high frequency transmission line, and therefore a variety of designs are possible.

(3) According to another feature of the present invention, in the high frequency semiconductor device as mentioned in (2) above, at least a portion of at least one of the back face wirings 3 and the front face wiring 5 is an inductor element.

In this way, at least one of the back face wirings 3 and the front face wiring 5 can be utilized for impedance matching between stages or between an input and an output, or forming a passive element conductor pattern 6 such as an inductor element that functions as a filter in a bias portion.

(4) According to another feature of the present invention, in the high frequency semiconductor device as mentioned in (3) above, the inductor element has a spiral form or a meandering (varying) form.

In this way, at least one of the back face wirings 3 and the front face wiring 5 can be utilized for impedance matching between stages or between an input and an output, or forming a spiral or meandering inductor element that functions as a filter in a bias portion.

(5) According to another feature of the present invention, in the high frequency semiconductor device as mentioned in (1) above, a protection layer 7 intervenes between the covering electrode 8 and the active region.

The clearance between the covering electrode 8 and the surface of the high frequency semiconductor chip 2 is determined by a thickness of the protection layer 7, and therefore is kept constant irrespective of mounting condition.

(6) According to another feature of the present invention, the high frequency semiconductor device as mentioned in (5) above further comprises a capacitance electrode on at least one of the front face side and the back face side of the high frequency semiconductor chip 2, wherein the capacitance electrode forms a capacitance element together with the covering electrode 8.

In this way, at least one of the back face wirings 3 and the front face wiring 5 can be utilized to form a capacitance electrode or form together with the covering electrode 8 a capacitor element that performs impedance matching between stages or between an input and an output, or performs as a filter in a bias portion. It is easy to form a capacitance since only a patterning of the capacitance electrode is required.

(7) According to another feature of the present invention, in the high frequency semiconductor device as mentioned in (6) above, the protection layer 7 is made of silicon nitride.

The silicon nitride protection layer can give a large capacitance even if the capacitor has a small area.

(8) According to another feature of the present invention, the high frequency semiconductor device as mentioned in (1) above further comprises a back face electrode 4 provided on the back face side of the high frequency semiconductor chip 2, and the back face electrode is an input or output terminal of an electric potential for the high frequency semiconductor chip 2.

(9) According to another feature of the present invention, in the high frequency semiconductor device as mentioned in (8) above, the back face electrode 4 is a wire-bonding pad.

(10) According to another feature of the present invention, in the high frequency semiconductor device as mentioned in (8) above, the back face electrode 4 is a bump connection pad for mounting another semiconductor chip thereon.

In this way, the back face electrode 4 can be provided on the back face side of the high frequency semiconductor chip 2. The back face electrode 4 can be an input or output terminal of an electric potential for the high frequency semiconductor chip 2 and can function as a wire-bonding pad or a connecting pad for a bump of other semiconductor chip.

(11) According to another feature of the present invention, the high frequency semiconductor device as mentioned in (1) above further comprises a front face electrode provided at a region where the covering electrode 8 does not exist on the front face side of the high frequency semiconductor chip 2, and the front face electrode is an input or output terminal of an electric potential for the high frequency semiconductor chip.

(12) According to another feature of the present invention, in the high frequency semiconductor device as mentioned in (11) above, the front face electrode is a connecting pad for connecting to a connecting bump.

In this way, the front face electrode 31, 32 can be provided on the front face side of the high frequency semiconductor chip 2. The front face electrode 31, 32 can be an input or output terminal of an electric potential for the high frequency semiconductor chip 2 and can function as a connecting pad for a bump.

(13) According to another feature of the present invention, for the high frequency semiconductor device as mentioned in (1) above, the front face of the high frequency semiconductor chip 2 is a mounting face.

In this manner, if the front face of the high frequency semiconductor chip 2 is a mounting face, the chip 2 can be laid face-down on a wiring substrate and no wire-bonding is required.

(14) According to another feature of the present invention, in the high frequency semiconductor device as mentioned in (13) above, the high frequency semiconductor chip is mounted on a mounting substrate comprising a wiring board.

(15) According to another feature of the present invention, in the high frequency semiconductor device as mentioned in (13) above, the high frequency semiconductor chip is mounted on the mounting substrate comprising a semiconductor chip.

In this case, the high frequency semiconductor chip 2 can be mounted on a wiring substrate or another semiconductor chip. This other semiconductor chip can have active regions or can be just a mounting substrate.

(16) According to another feature of the present invention, a high frequency semiconductor device including a high frequency semiconductor chip 2 comprises: an active region provided on a front face side of the high frequency semiconductor chip; a covering electrode 8 provided on the active region and connected to a ground potential; and a back face passive element provided on a back face side of the high frequency semiconductor chip. The covering electrode 8 functions as a high frequency ground plate for the back face passive element.

In this way, a back face passive element can be provided on a back face side of the high frequency semiconductor chip. The covering electrode 8 functions as a high frequency ground plate for the back face passive element. Accordingly, the ground plate can be kept stable for the passive element.

(17) According to another feature of the present invention, in the high frequency semiconductor device as mentioned in (16) above, the active region and the back face passive element are arranged so as not to overlap with each other.

In this way, by arranging the active region and the back face passive element to avoid overlapping, of electrical interference thereamong can be prevented.

DESCRIPTION OF THE PREFERRED EMBODIMENTS

In the following, embodiments of the present invention will be described with reference to the accompanying drawings.

Figure 1:
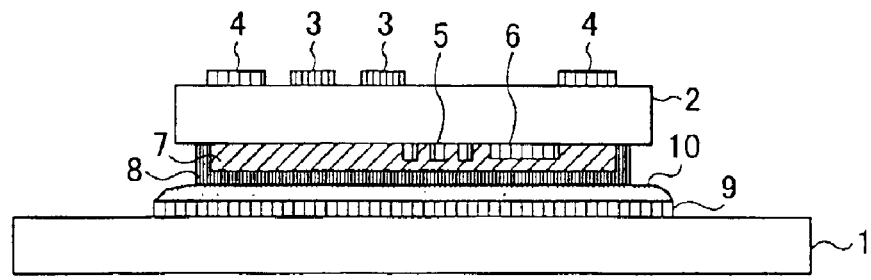
FIG. 1 shows a schematic cross-sectional view of a high frequency semiconductor device to explain the principle of the present invention.
Figure 2:
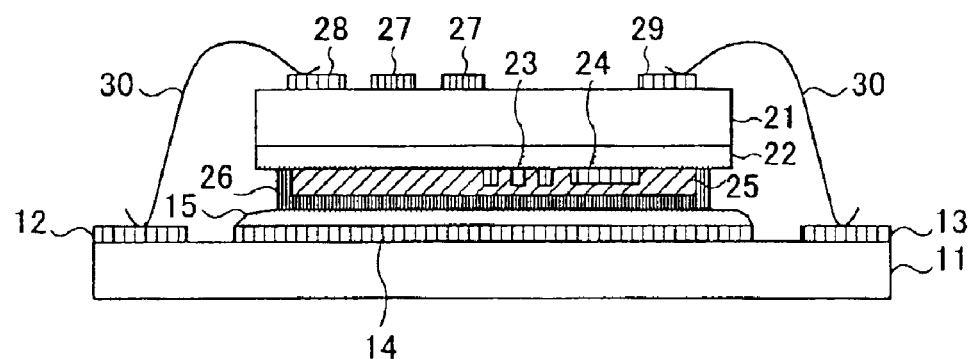
FIG. 2 shows a schematic cross-sectional view of a mounting structure of a high frequency semiconductor device according to a first embodiment of the present invention.

Referring to FIG. 2, a mounting structure of a high frequency semiconductor device according to a first embodiment of the present invention will be explained.

FIG. 2 shows a schematic cross-sectional view of the mounting structure of the high frequency semiconductor device according to the first embodiment of the present invention. A high frequency semiconductor chip includes a GaAs substrate 21 and an epitaxial layer 22 on the substrate 21. Active elements such as HEMT are formed on the epitaxial layer 22. After forming desired elements on the epitaxial layer 22, an interlaminer insulating layer (not shown) is formed and front face wirings 23 and a capacitance electrode 24 are formed thereon.

Next, on the front face side of the chip having the front face wirings 23 and the capacitance electrode 24, a SiN layer is deposited to form a protection layer 25. On the protection layer 25, a metal material such as Au is vapor deposited to form a covering electrode 26.

On the other hand, on the back face side of the high frequency semiconductor chip, back face wirings 27, a back face input pad 28 and a back face output pad 29 are formed. The input pad 28 can input a signal to the high frequency semiconductor chip, and the output pad 29 can output a signal from the high frequency semiconductor chip.

These back face wirings 27, the back face input pad 28 and the back face output pad 29 are connected to the active elements or the front face wirings 23 on the front face side of the chip through a via (not shown).

At least some of the front face wirings 23 constitute bias circuits that do not function as high frequency transmission lines. Some of the front face wirings 23 can form an MSL type of high frequency transmission line together with the covering electrode 26.

A capacitor element can be formed by the capacitance electrode 24 and the covering electrode 26. On the other hand, the back face wirings 27 also can form an MSL type of high frequency transmission line together with the covering electrode 26.

If desired, an inductor element as well as a capacitor element can be formed on the front face or the back face of the high frequency semiconductor chip. The inductor element can perform impedance matching between stages or between the input and output, or function as a filter in a bias portion. The inductor element may be a spiral inductor element or meandering inductor element.

The high frequency semiconductor chip is laid face-down on a wiring substrate 11 and the covering electrode 26 is electrically connected to a ground electrode 14 of an all-over pattern by a brazing material 15 such as Ag paste, to make the covering electrode 26 have ground potential.

An input pad 12 provided on the wiring substrate 11 and the back face input pad 28 are connected by a bonding wire 30, and an output pad 13 on the wiring substrate 11 and the back face output pad 29 are connected by a bonding wire 30 to complete the face-down mounting structure.

According to the first embodiment of the present invention, the distance between the covering electrode 26 and the front face of the high frequency semiconductor chip is controlled according to the thickness of the protection layer 25 that is made by a precise semiconductor manufacturing process, and therefore can be kept constant irrespective of mounting condition.

At least the main portions of the high frequency transmission lines are formed between the covering electrode 26 and the back face wirings 27 of the high frequency semiconductor chip. These are capacitively coupled via the high frequency semiconductor chip, and therefore their electrostatic capacitance becomes smaller. Accordingly, the wiring width of the back face wirings 27 can be broadened (increased) to get a large current capacity.

A high dielectric SiN layer can be employed as the protection layer 25, and therefore a large capacitance can be obtained even if the area of the capacitance electrode 24 is small.

Next, referring to FIG. 3, a mounting structure of a high frequency semiconductor device according to a second embodiment of the present invention will be explained.

Figure 3:
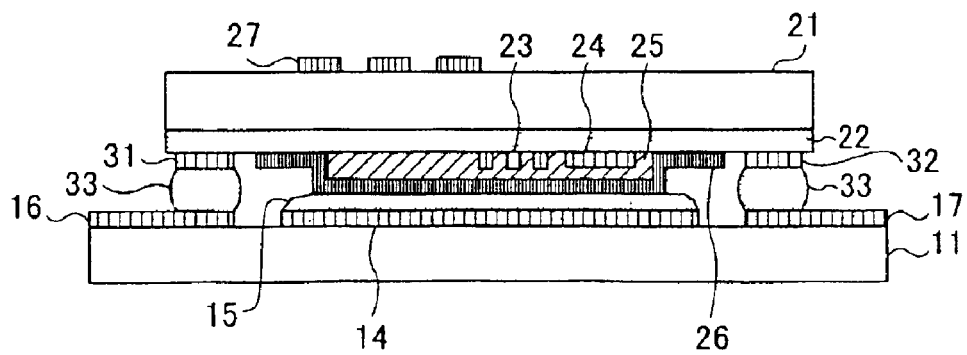
FIG. 3 shows a schematic cross-sectional view of a mounting structure of a high frequency semiconductor device according to a second embodiment of the present invention.

FIG. 3 shows a schematic cross-sectional view of the mounting structure of the high frequency semiconductor device according to the second embodiment of the present invention. In this embodiment, an input pad 31 and an output pad 32 are provided on the front face side of the high frequency semiconductor chip. The input pad 31 and an input pad 16 provided on the wiring substrate 11 are connected by a bump 33. The output pad 32 and an output pad 17 provided on the wiring substrate 11 are connected by a bump 33. Otherwise, the basic structure of the high frequency semiconductor chip in this embodiment is the same as that of the first embodiment.

In this embodiment, the covering electrode 26 extends to an outer area where the protection layer 25 does not exist. A high frequency transmission line is formed also between this extended covering electrode 26 and the back face wirings 27. In this case, the thickness of the dielectric layer is thin and therefore the width of the transmission line can be narrow.

In the second embodiment of the present invention, the high frequency semiconductor chip is bonded to the substrate by face-down bonding without bonding wire, and therefore the lead-out of electrodes can be minimized.

Next, referring to FIGS. 4 and 5, a mounting structure of a high frequency semiconductor device according to a third embodiment of the present invention will be explained.

Figure 4:
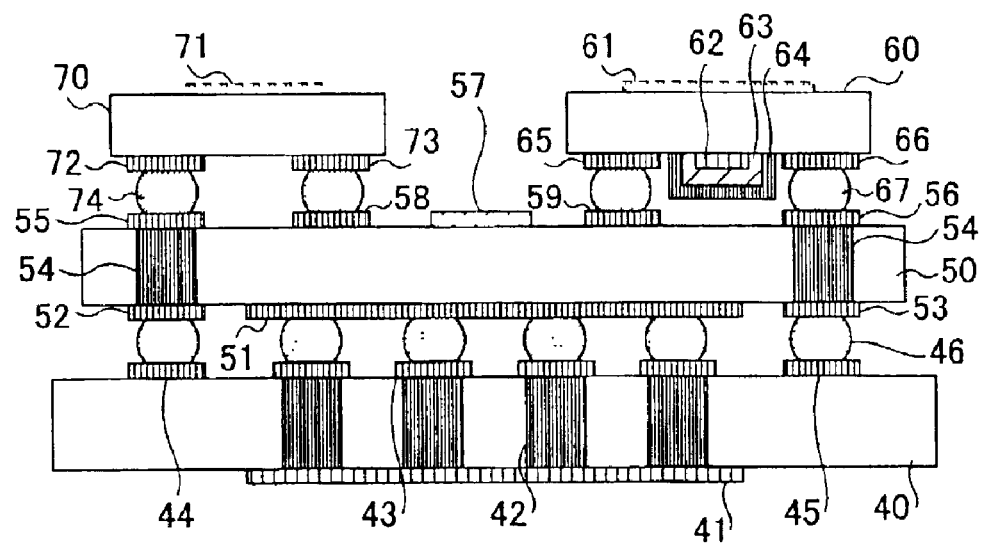
FIG. 4 shows a schematic cross-sectional view of a mounting structure of a high frequency semiconductor device according to a third embodiment of the present invention.

FIG. 4 shows a schematic cross-sectional view of the mounting structure of the high frequency semiconductor device according to the third embodiment of the present invention. FIG. 5 shows a schematic top plan view of the high frequency semiconductor chip shown in FIG. 4.

In this embodiment, a wiring substrate 40 has a ground electrode 41 on a back face thereof, a plurality of grounding pads 43 provided on a front face thereof and connected to the ground electrode 41 through vias 42, and an input pad 44 and an output pad 45 at the opposite ends. A semiconductor chip 50 is mounted on the substrate 40 by using bumps 46.

On a back face of the semiconductor chip 50, a ground electrode 51, a back face input pad 52, and a back face output pad 53 are formed, and these are connected to the grounding pads 43, the input pad 44 and the output pad 45 respectively by the bumps 46.

Figure 5:
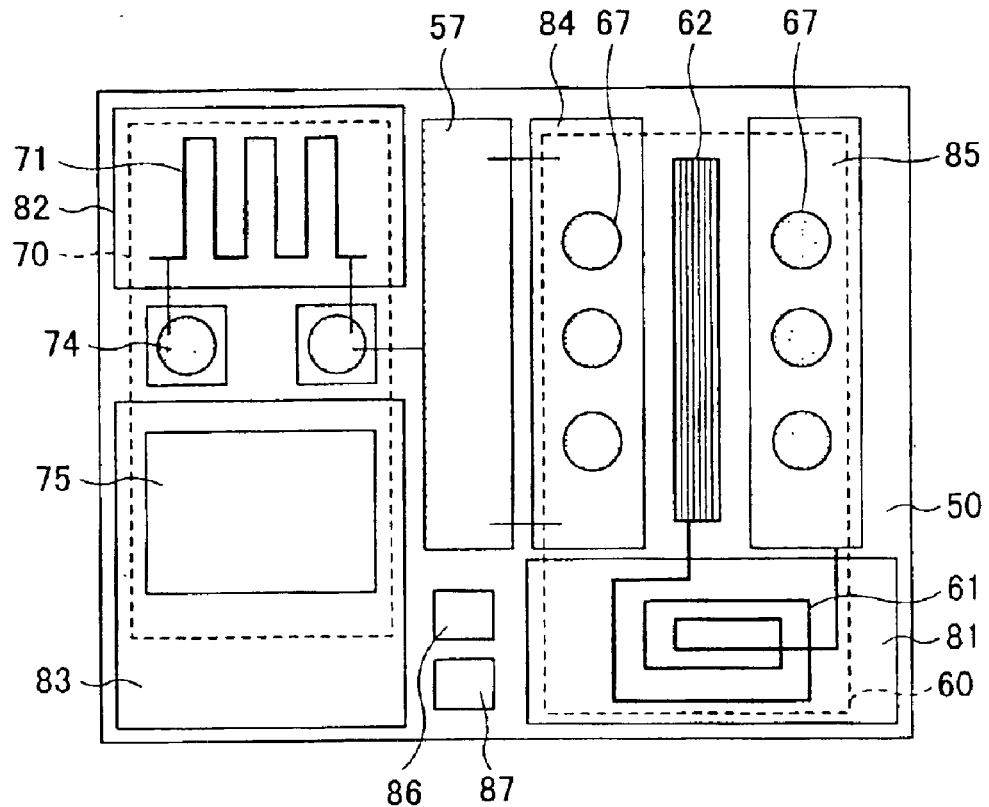
FIG. 5 shows a schematic top plan view of the high frequency semiconductor chip shown in FIG. 4.
Figure 6:
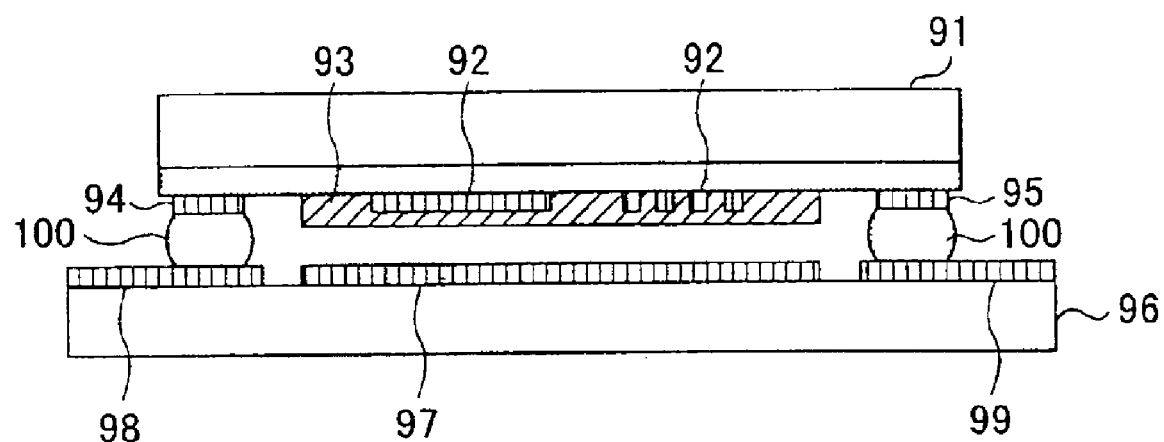
FIG. 6 shows a schematic cross sectional view of a prior art facedown mounting structure.
Figure 7:
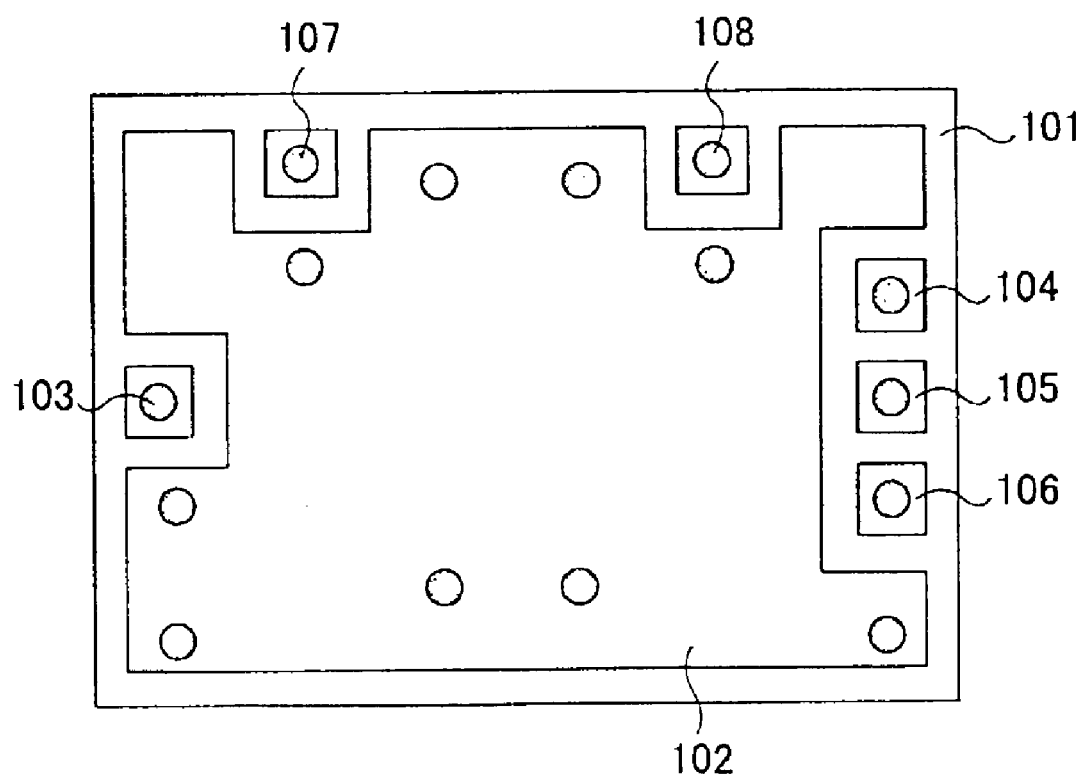
FIG. 7 shows one example of surface wiring patterns of prior art wiring substrates.

As shown in FIG. 5, on a front face of the semiconductor chip 50 are formed an active region 57 having FETs and the like, ground electrodes 81 through 83, contacting regions 84, 85 as input/output portions of the FETs, an internal input pad 59 for contacting partially to the contacting regions 84, 85, and front face output pad 56. Further, a front face input pad 55 and an internal output pad 58 are formed, and, if required, capacitor elements 86, 87 can be formed.

The contacting regions 84, 85 are shown as just a rectangular shape for simplicity, but external lead-out terminals of some active elements are formed and electrically separated from each other in actual configuration.

Regarding the semiconductor chip 50 as a mounting substrate, high frequency semiconductor chips 60, 70 having covering electrodes 64 as explained in the above second embodiment are face-down mounted on the chip 50 by using bumps 67, 74 as shown in FIG. 4. In this figure, back face wirings for forming high frequency transmission lines are omitted.

In this embodiment, the structures of the high frequency semiconductor chips 60, 70 are just examples. On a back face of the high frequency semiconductor chip 60, a spiral inductor element 61 is formed so that it does not overlap with an active region provided on a front face side of the chip 60 but lies opposite to a ground electrode 81 provided on the semiconductor chip 50.

On a back face of the high frequency semiconductor chip 70, a meandering inductor element 71 is formed so that it does not overlap with active regions provided on a front face side of the chip 70 but lies opposite to a ground electrode 82 provided on the semiconductor chip 50.

The third embodiment of the present invention can give a multi chip mounting structure with small variations in characteristic impedance of high frequency transmission lines.

Although the preferred embodiments of the present invention are explained above, the present invention is not limited to these embodiments, but various variations and modifications may be made without departing from the scope of the present invention.

For example, a substrate for forming a high frequency semiconductor chip is not limited to a GaAs substrate, but can be any III–V type composition semiconductor substrate such as an InP substrate.

The present invention can be applied to a high frequency semiconductor chip having optical devices such as a semiconductor laser or an avalanche photodiode employed in a high frequency region. Further, a high frequency semiconductor chip having no positive element can be used.

Although a SiN layer is used as a protection layer to increase the capacitance of a capacitor element in the above embodiments, the present invention is not limited to the SiN layer but can employ other insulating layers such as $SiO_2$.

In the third embodiment, the uppermost semiconductor chip is the only high frequency semiconductor chip. However, the middle semiconductor chip also can be a high frequency semiconductor chip having a covering electrode. In that case, the middle semiconductor chip is face-down mounted, and a back face electrode provided on a back face of the middle semiconductor chip can be utilized for face-down mounting the uppermost semiconductor chip thereon.

Further, it is possible that the middle semiconductor chip is the only high frequency semiconductor chip and face-down mounted on the lowermost substrate, and the uppermost semiconductor chip having no covering electrode is face-down mounted on back face electrodes provided on a back face of the middle semiconductor chip.

The multi chip mounting structure according to the present invention is not limited to two-stage mounting structure but can be applied to a mounting structure of three or more stages.

According to the present invention, a high frequency transmission line is formed by a covering electrode provided on a front face of a high frequency semiconductor chip and a back face wiring provided on a back face of the chip, and therefore a high frequency semiconductor device with small electrostatic capacitance and small variations in characteristic impedance can be obtained without depending on mounting conditions.

The present application is based on Japanese priority application No. 2001-364165 filed on Nov. 29, 2001 with the Japanese Patent Office, the entire contents of which are hereby incorporated by reference.

What is claimed is:

1. A high frequency semiconductor device including a high frequency semiconductor chip, comprising:
   an active region and a front face wiring provided on a front face side of the high frequency semiconductor chip;
   a covering electrode covering the active region and the front face wiring, and connected to a ground potential;
   a protection layer intervening between the covering electrode, and the active region and the front face wiring; and
   a back face wiring provided on a back face side of the high frequency semiconductor chip, and forming a high frequency transmission line together with the covering electrode as a high frequency ground plate,
   wherein the front face wiring forms another high frequency transmission line together with the covering electrode.

2. The high frequency semiconductor device as claimed in claim 1, wherein at least a portion of at least one of the back face wiring and the front face wiring is an inductor element.

3. The high frequency semiconductor device as claimed in claim 2, wherein the inductor element has a spiral form or a meandering form.

4. The high frequency semiconductor device as claimed in claim 1, further comprising a capacitance electrode on at least one of the front face side and the back face side of the high frequency semiconductor chip, wherein the capacitance electrode forms a capacitance element together with the covering electrode.

5. The high frequency semiconductor device as claimed in claim 1, wherein the protection layer is made of silicon nitride.

6. The high frequency semiconductor device as claimed in claim 1, further comprising a back face electrode provided on the back face side of the high frequency semiconductor chip, the back face electrode being an input or output terminal of an electric potential for the high frequency semiconductor chip.

7. The high frequency semiconductor device as claimed in claim 6, wherein the back face electrode is a wire-bonding pad.

8. The high frequency semiconductor device as claimed in claim 6, wherein the back face electrode is a bump connection pad for mounting another semiconductor chip thereon.

9. The high frequency semiconductor device as claimed in claim 1 further comprising a front face electrode provided at a region where the covering electrode does not exist on the front face side of the high frequency semiconductor chip, wherein the front face electrode is an input or output terminal of an electric potential for the high frequency semiconductor chip.

10. The high frequency semiconductor device as claimed in claim 9, wherein the front face electrode is a bump connection pad for connecting to a connecting bump.

11. The high frequency semiconductor device as claimed in claim 1, wherein the front face side of the high frequency semiconductor chip is a mounting face.

12. The high frequency semiconductor device as claimed in claim 11, wherein the high frequency semiconductor chip is mounted on a mounting substrate comprising a wiring board.

13. The high frequency semiconductor device as claimed in claim 11, wherein the high frequency semiconductor chip is mounted on the mounting substrate comprising a semiconductor chip.

14. A high frequency semiconductor device including a high frequency semiconductor chip, comprising:

an active region and a front face wiring provided on a front face side of the high frequency semiconductor chip;

a covering electrode covering the active region and the front face wiring, and connected to a ground potential;

a protection layer intervening between the covering electrode, and the active region and the front face wiring; and a back face passive element provided on a back face side of the high frequency semiconductor chip, wherein the covering electrode functions as a high frequency ground plate for the back face passive element, wherein the front face wiring forms a high frequency transmission line together with the covering electrode as a ground plate.

15. The high frequency semiconductor device as claimed in claim 14, wherein the active region and the back face passive element are arranged so as not to overlap with each other.

* * * * *